(12) United States Patent
Cohen et al.

(10) Patent No.: US 12,396,376 B2
(45) Date of Patent: Aug. 19, 2025

(54) PIEZOELECTRIC MEMORY

(71) Applicant: International Business Machines Corporation, Armonk, NY (US)

(72) Inventors: Guy M. Cohen, Ossining, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 17/978,954

(22) Filed: Nov. 1, 2022

(65) Prior Publication Data
US 2024/0147873 A1 May 2, 2024

(51) Int. Cl.
*H10N 70/20* (2023.01)
*G11C 13/00* (2006.01)
*H10N 70/00* (2023.01)

(52) U.S. Cl.
CPC ......... *H10N 70/24* (2023.02); *G11C 13/0007* (2013.01); *G11C 13/004* (2013.01); *G11C 13/0069* (2013.01); *H10N 70/8836* (2023.02); *G11C 2013/0095* (2013.01); *G11C 2213/31* (2013.01); *G11C 2213/55* (2013.01)

(58) Field of Classification Search
CPC ............... H10N 70/24; H10N 70/8836; G11C 13/0007; G11C 13/004; G11C 13/0069; G11C 2013/0095; G11C 2213/31; G11C 2213/55; G11C 13/0002
USPC ........................................................ 365/148
See application file for complete search history.

(56) References Cited

U.S. PATENT DOCUMENTS

| | | |
|---|---|---|
| 6,339,543 B1 | 1/2002 | Shimada |
| 6,829,157 B2 | 12/2004 | Kim |
| 9,379,162 B2 | 6/2016 | Bandyopadhyay |
| 9,552,858 B2 | 1/2017 | Liu |
| 10,032,829 B2 | 7/2018 | Fukuzawa |

(Continued)

FOREIGN PATENT DOCUMENTS

| | | | |
|---|---|---|---|
| CA | 3046162 A1 * | 6/2018 | ............ G11C 11/15 |
| CN | 101207179 A | 6/2008 | |

(Continued)

OTHER PUBLICATIONS

Crawford, J. C. (1971). A Ferroelectric-Piezoelectric Random Access Memory. IEEE Transactions on Electron Devices, 18(10), 951-958. doi:10.1109/t-ed.1971.17309. See highlighted portions in PDF file provided.

(Continued)

*Primary Examiner* — Fernando Hidalgo
(74) *Attorney, Agent, or Firm* — Yuanmin Cai; Otterstedt & Kammer PLLC (57) ABSTRACT

A non-volatile memory apparatus includes a first hydrogen reservoir, which is electrically conductive; a charge of hydrogen, which is captured in the first hydrogen reservoir; a dielectric layer that has a first side that is adjacent to the first hydrogen reservoir and a second side that is opposite from the first hydrogen reservoir; a second hydrogen reservoir that is adjacent to the second side of the dielectric layer, is electrically conductive, and has a side that is opposite from the dielectric layer; and a piezoelectric layer that is adjacent to the side of the second hydrogen reservoir and that has a side that is opposite from the second hydrogen reservoir.

20 Claims, 6 Drawing Sheets

(56) References Cited

U.S. PATENT DOCUMENTS

| | | | |
|---|---|---|---|
| 2006/0133137 A1* | 6/2006 | Shin | G11C 11/15 |
| | | | 365/158 |
| 2008/0142925 A1 | 6/2008 | Bednorz | |
| 2009/0116277 A1* | 5/2009 | Tran | G01N 27/122 |
| | | | 977/932 |
| 2009/0179245 A1 | 7/2009 | Karg | |
| 2012/0043518 A1 | 2/2012 | Cheng | |
| 2013/0062996 A1* | 3/2013 | Udayakumar | H10N 39/00 |
| | | | 310/321 |
| 2016/0315091 A1 | 10/2016 | Okuyama | |
| 2018/0217117 A1* | 8/2018 | Tran | H10N 70/011 |
| 2019/0148126 A1* | 5/2019 | Nilsson | C08F 8/04 |
| | | | 525/199 |
| 2019/0172998 A1 | 6/2019 | Tan | |
| 2020/0235294 A1 | 7/2020 | Fompeyrine | |

FOREIGN PATENT DOCUMENTS

| | | | | |
|---|---|---|---|---|
| CN | 101237024 A | | 8/2008 | |
| CN | 101911204 A | | 12/2010 | |
| CN | 103069569 A | | 4/2013 | |
| CN | 102956812 B | | 7/2015 | |
| CN | 111477739 A | | 7/2020 | |
| CN | 112002361 A | * | 11/2020 | G11C 11/2275 |
| CN | 115241375 A | | 10/2022 | |
| EP | 3555887 B1 | | 10/2020 | |
| WO | WO-2018109441 A1 | * | 6/2018 | G11C 11/15 |

OTHER PUBLICATIONS

Niemier, M. T., Bernstein, G. H., Csaba, G., Dingler, A., Hu, X. S., Kurtz, S., . . . & Varga, E. (2011). Nanomagnet logic: progress toward system-level integration. Journal of Physics: Condensed Matter, 23(49), 493202. See highlighted portions in PDF file provided.

Wei Z, Peng X, Wang J, Yin H, Gong N. Novel CMOS SRAM voltage latched sense amplifiers design based on 65 nm technology. In2014 12th IEEE International Conference on Solid-State and Integrated Circuit Technology (ICSICT) Oct. 28, 2014 (pp. 1-3). IEEE.

Hemaprabha A, Vivek K. Comparative analysis of sense amplifiers for memories. In2015 International Conference on Innovations in Information, Embedded and Communication Systems (ICIIECS) Mar. 19, 2015 (pp. 1-6). IEEE.

ISR and Written Opinion, related PCT Appln., PCT/CN2023/126340, Jan. 12, 2024, 9 pages, China National IP Admin. as ISA, Authorized Officer Yi Bing Wang.

Wagner et al. "Mechanical stress and stress release channels in 10-350 nm palladium hydrogen thin films with different microstructures", Acta Materialia, Aug. 1, 2016, pp. 116-125, vol. 114, 10 pages.

* cited by examiner

Prior Art

FIG. 7

PIEZOELECTRIC MEMORY

BACKGROUND

The present invention relates to the electrical, electronic, and computer arts, and more specifically, to non-volatile memory devices.

Computing memory devices are categorized as volatile or non-volatile. Volatile memory devices include static random access memory (SRAM) and dynamic random access memory (DRAM). Volatile memory devices do not retain data when electrical power is not supplied. In particular, SRAM requires a continuous voltage supply to keep its flip-flop register locked, while DRAM requires frequent refreshes of its capacitor. Non-volatile memory devices include NAND-gate (flash), magnetoresistive (MRAM), ferroelectric (FeRAM), resistive (RRAM), and phase change (PCM) technologies. Non-volatile memory retains data for a period of time when electrical power is not supplied.

SUMMARY

Principles of the invention provide techniques for piezoelectric memory.

In one aspect, an exemplary non-volatile memory apparatus includes a first hydrogen reservoir, which is electrically conductive; a charge of hydrogen, which is captured in the first hydrogen reservoir; a dielectric layer that has a first side that is adjacent to the first hydrogen reservoir and a second side that is opposite from the first hydrogen reservoir; a second hydrogen reservoir that is adjacent to the second side of the dielectric layer, is electrically conductive, and has a side that is opposite from the dielectric layer; and a piezoelectric layer that is adjacent to the side of the second hydrogen reservoir and that has a side that is opposite from the second hydrogen reservoir.

Another aspect provides a method for operating a non-volatile memory apparatus. The apparatus includes first and second hydrogen reservoirs, a dielectric layer that partitions the hydrogen reservoirs, a piezoelectric layer that is adjacent to the second hydrogen reservoir, and a neutral layer that is at a side of the piezoelectric layer opposite from the second hydrogen reservoir. The method includes setting a high bit on the memory apparatus by inducing a strain on the piezoelectric layer; inducing the strain includes moving hydrogen from the first hydrogen reservoir through the dielectric layer to the second hydrogen reservoir. Moving the hydrogen includes applying an electric field across the hydrogen reservoirs.

According to another aspect, a piezoelectric memory apparatus includes a piezoelectric layer; programmable means for placing and removing a strain on the piezoelectric layer; and a readout circuit that is connected to the programmable means.

In view of the foregoing, techniques of the present invention can provide substantial beneficial technical effects. For example, one or more embodiments provide one or more of:

A memory element that is electrically decoupled from its readout device.

Very low energy dissipation for reading memory.

Employment of well-known materials that are compatible with semiconductor fabrication processes.

A multilevel (analog) memory element.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
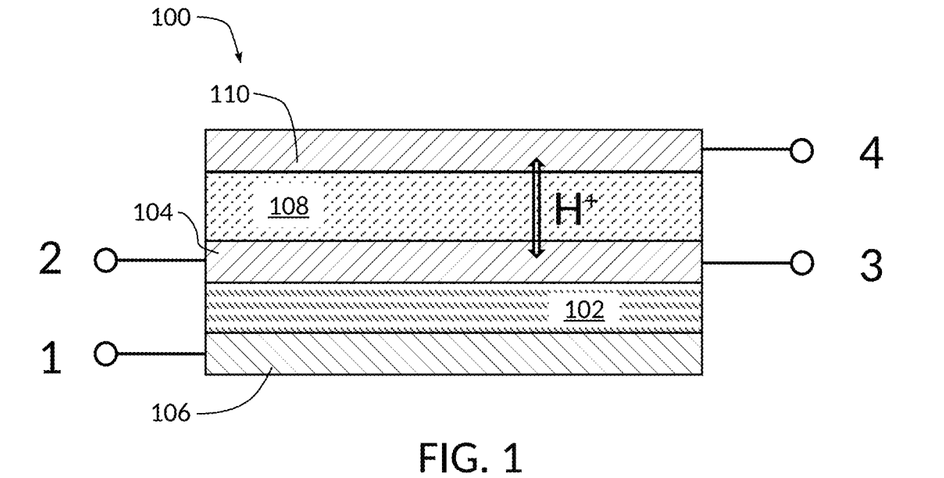
FIG. 1 depicts, in a schematic, a planar configuration of a piezoelectric memory element, according to exemplary embodiments.

FIG. 1 depicts, in a schematic, a cross section through a piezoelectric memory element 100 having a generally planar configuration of a piezoelectric memory element 100, according to exemplary embodiments. The memory element 100 includes a piezoelectric layer 102, with a first hydrogen reservoir 104 that is adjacent to an upper side of the piezoelectric layer and a neutral layer 106 that is adjacent to a lower side of the piezoelectric layer. At an upper side of the first hydrogen reservoir there is a dielectric 108, which is permeable to hydrogen, and at an upper side of the dielectric there is a second hydrogen reservoir 110. Readout terminals 1, 2 are connected across the first hydrogen reservoir 104 and the neutral layer 106. Programming terminals 3, 4 are connected across the first and second hydrogen reservoirs 104, 110.

The hydrogen reservoirs and the neutral layer include conductive materials, e.g., metals. In one or more embodiments, each of the first and second hydrogen reservoirs includes the same metal. In one or more embodiments, each of the first and second hydrogen reservoirs includes a metal selected from the list consisting of: palladium, platinum, vanadium, tungsten, hafnium, zirconium, niobium, tantalum, and titanium.

The dielectric, as will be understood by an ordinary skilled worker, is permeable to hydrogen but is a good electrical insulator (blocks flow of electrons but allows the transport of $H^+$ (protons)). Phosphosilicate glass is one non-limiting example of a suitable dielectric. Other, similar materials could be used.

The piezoelectric material, in one or more embodiments, is selected to be compatible with semiconductor fabrication processes. For example, the piezoelectric material may be any of lead zirconate titanate, lithium niobate, and ferroelectric hafnium oxide. Undoped and properly annealed (orthorhombic) hafnium oxide can be employed, or, in one or more embodiments, hafnium oxide may be doped to stabilize its ferroelectric phase, e.g., doped with one of zirconium, silicon, aluminum, lanthanum, yttrium, or nitrogen. Note also that lead zirconate titanate is an inorganic compound with the chemical formula Pb[$Zr_xTi_{1-x}$]$O_3$ (0≤x≤1), commonly abbreviated as PZT and also called lead zirconium titanate.

Figure 3:
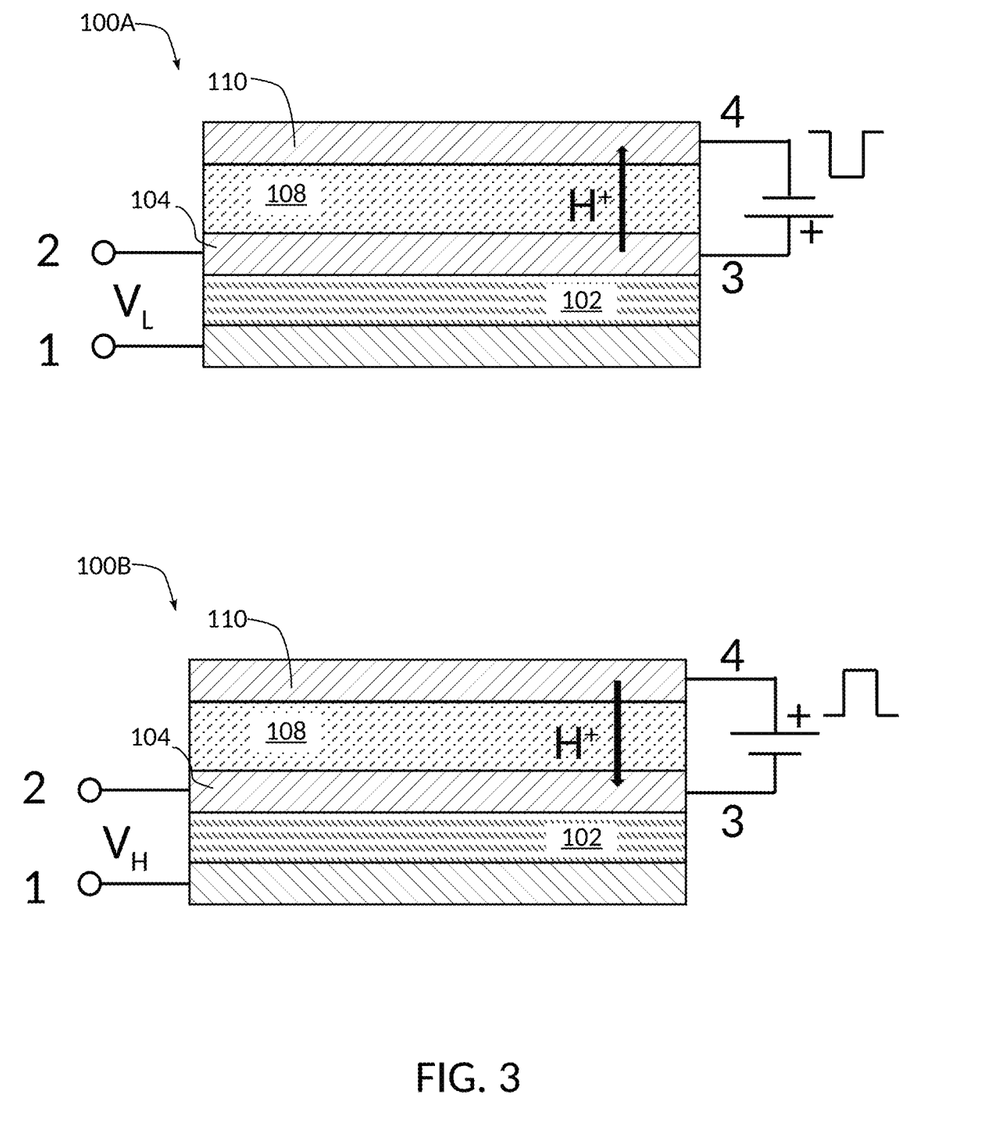
FIG. 3 depicts, in schematics, programming the piezoelectric memory element that is shown in FIG. 1.

In operation of the memory element 100, as shown in FIG. 3, a positive voltage applied from terminal 4 to terminal 3 causes a hydrogen charge W to move from the first hydrogen reservoir 104 through the dielectric 108 to the second hydrogen reservoir 110. This configuration 100A diminishes the volume of the first hydrogen reservoir, which exerts a compressive (contractive) strain on the piezoelectric layer 102. The dynamic contraction of the piezoelectric layer 102 produces a charge, which can be read either as a low (zero) bit or as a high (one) bit in a manner to be discussed below. On the other hand, a positive voltage applied from terminal 3 to terminal 4 causes the hydrogen charge W to move from the second hydrogen reservoir 110 to the first hydrogen reservoir 104. This configuration 100B increases the volume of the first hydrogen reservoir, which exerts a tensile strain on the piezoelectric layer 102. The dynamic expansion of the piezoelectric layer 102 produces a charge, which can be read either as a high (one) bit or as a low (zero) bit in a manner to be discussed below.

Depending on the piezoelectric material used as well as the piezoelectric layer thickness, the memory element 100 can hold a charge (latency) for seconds, hours, or even days. In one or more embodiments, the piezoelectric layer 102 is on the order of about 10 nm to about 50 nm thick while an area of the (square) piezoelectric layer is about 2500 $nm^2$. In other embodiments, the piezoelectric layer may be non-square, e.g., circular, or a rectangle with length of about 50 nm and an aspect ratio of 2:1 or even 5:1 (length:width).

Figure 2:
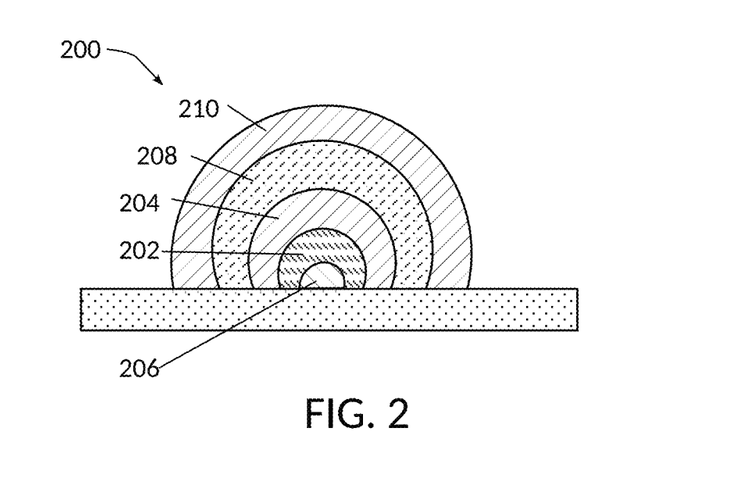
FIG. 2 depicts, in a schematic, a cylindrical configuration of a piezoelectric memory element, according to exemplary embodiments.

FIG. 2 depicts, in a schematic, a cross section through a piezoelectric memory element 200 having a generally cylindrical configuration of a piezoelectric memory element 200, according to exemplary embodiments. The memory element 200 includes a piezoelectric layer 202, with a first hydrogen reservoir 204 that is adjacent to an upper or outer side of the piezoelectric layer and a neutral layer 206 that is adjacent to an inner or lower side of the piezoelectric layer. At an outer side of the first hydrogen reservoir there is a dielectric 208, which is permeable to hydrogen, and at an outer side of the dielectric there is a second hydrogen reservoir 210. Readout terminals and programming terminals are not shown in FIG. 2, but are connected equivalent to the terminals 1, 2, 3, 4 that are shown in FIG. 1. The principles of operation of the cylindrical configuration are essentially the same as for the planar configuration. In one or more embodiments, the cylindrical shape may more effectively focus the strain in the first hydrogen reservoir onto the piezoelectric layer.

FIG. 3 depicts, in schematics, programming the piezoelectric memory element that is shown in FIG. 1, as already discussed above. In configuration 100A, the voltage between terminals 1 and 2 is lower than ground ($V_L$). In configuration 100B, the voltage between terminals 1 and 2 is higher than ground ($V_H$). Thus, the voltage would change polarity according to the directionality of stress placed on the piezoelectric layer.

Figure 4:
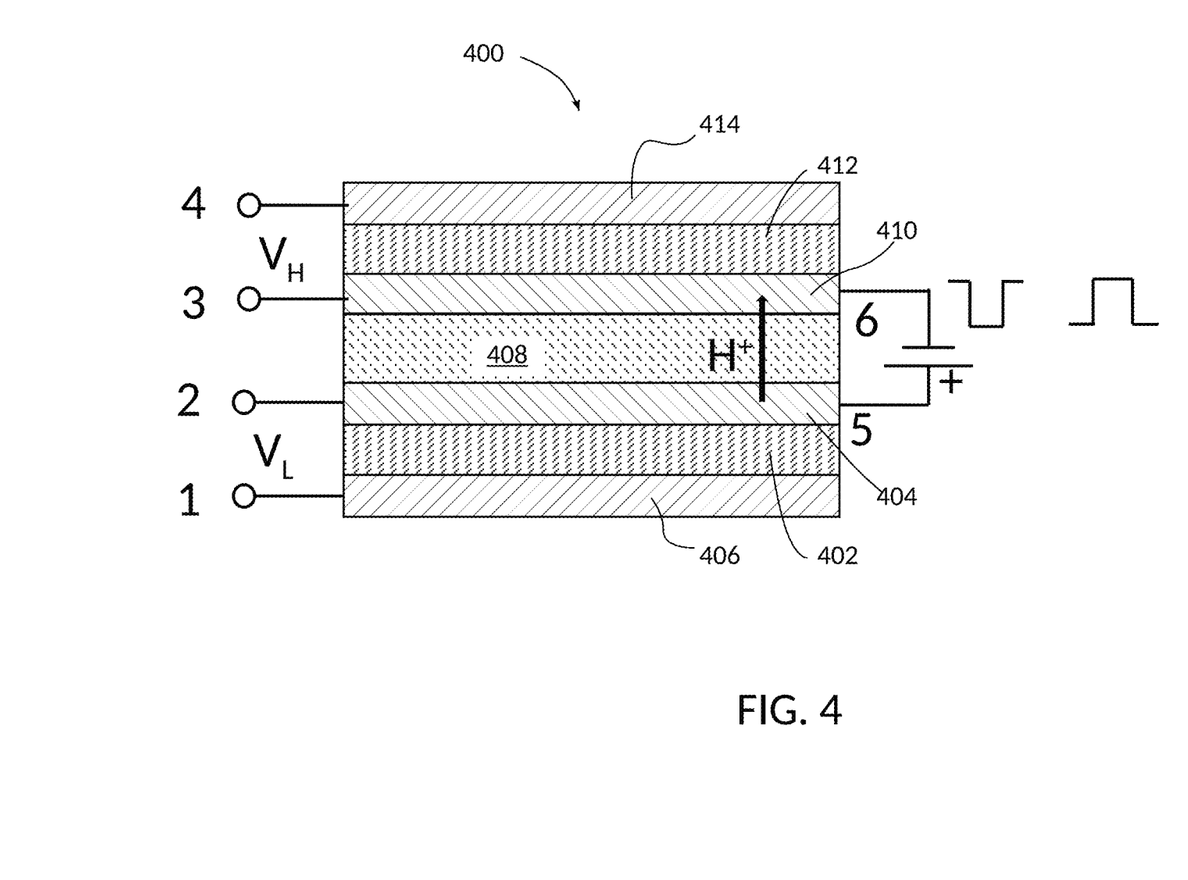
FIG. 4 depicts, in a schematic, a symmetric planar piezoelectric memory element, according to exemplary embodiments.

FIG. 4 depicts, in a schematic, a symmetric planar piezoelectric memory element 400, according to exemplary embodiments. The memory element 400 includes a first piezoelectric layer 402, with a first hydrogen reservoir 404 that is adjacent to an upper side of the piezoelectric layer and a first neutral layer 406 that is adjacent to a lower side of the piezoelectric layer. At an upper side of the first hydrogen reservoir there is a dielectric 408, which is permeable to hydrogen, and at an upper side of the dielectric there is a second hydrogen reservoir 410. At an upper side of the second hydrogen reservoir 410 there is a second piezoelectric layer 412 and at an upper side of the second piezoelectric layer 412 there is a second neutral layer 414. The neutral layers are connected to electrical ground. Readout terminals 1, 2 are connected across the first hydrogen reservoir 404 and the first neutral layer 406; readout terminals 3, 4 are connected across the second hydrogen reservoir 410 and the second neutral layer 414; programming terminals 5, 6 are connected across the first and second hydrogen reservoirs. Providing a voltage to the programming terminals that moves the hydrogen charge from the second hydrogen reservoir to the first hydrogen reservoir produces a contractive strain on the second piezoelectric layer and a tensile strain on the first piezoelectric layer. Such a situation results in the voltages shown in FIG. 5 and in FIG. 6, $V_H$ being further from ground than $V_L$. Providing a voltage to the programming terminals that moves the hydrogen charge from the first hydrogen reservoir to the second hydrogen reservoir produces a contractive strain on the first piezoelectric layer and a tensile strain on the second piezoelectric layer.

Figure 5:
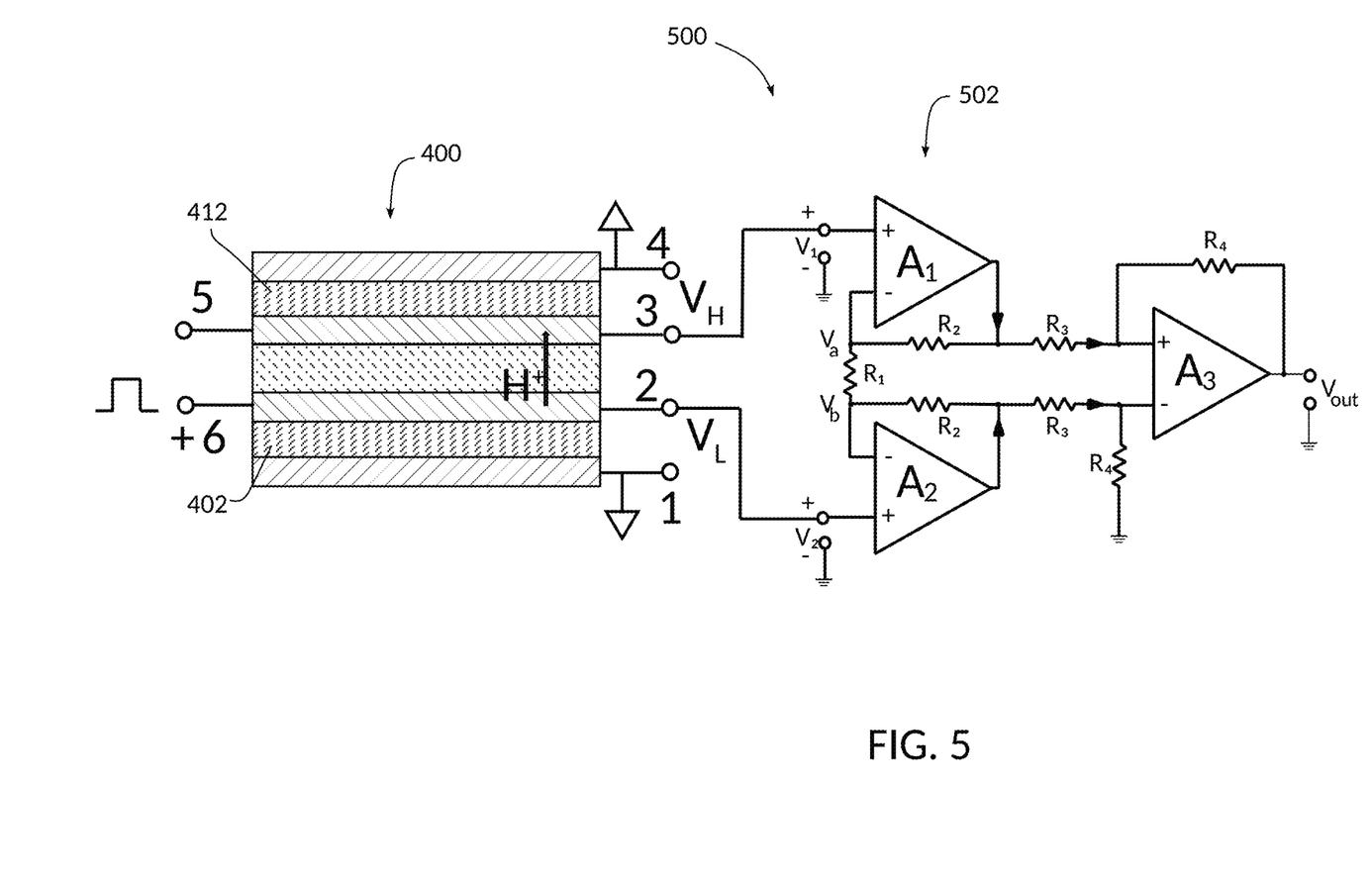
FIG. 5 depicts, in a schematic, a memory circuit that includes the symmetric planar piezoelectric memory element that is shown in FIG. 4.

FIG. 5 depicts, in a schematic, a memory circuit 500 that includes the symmetric planar piezoelectric memory element 400 that is shown in FIG. 4, as well as a readout circuit 502 that is connected across the readout terminals 2, 3. The readout circuit 502 includes three operational amplifiers (op-amps) A1, A2, A3, which are connected with resistors R1, R2, R3, R4 as shown to amplify the voltage difference between the two piezoelectric layers 402, 412 of the memory element 400. The op-amps A1 and A2 are connected as voltage followers and operate as input buffers to the inputs of op-amp A3, which functions as a differential amplifier.

Figure 6:
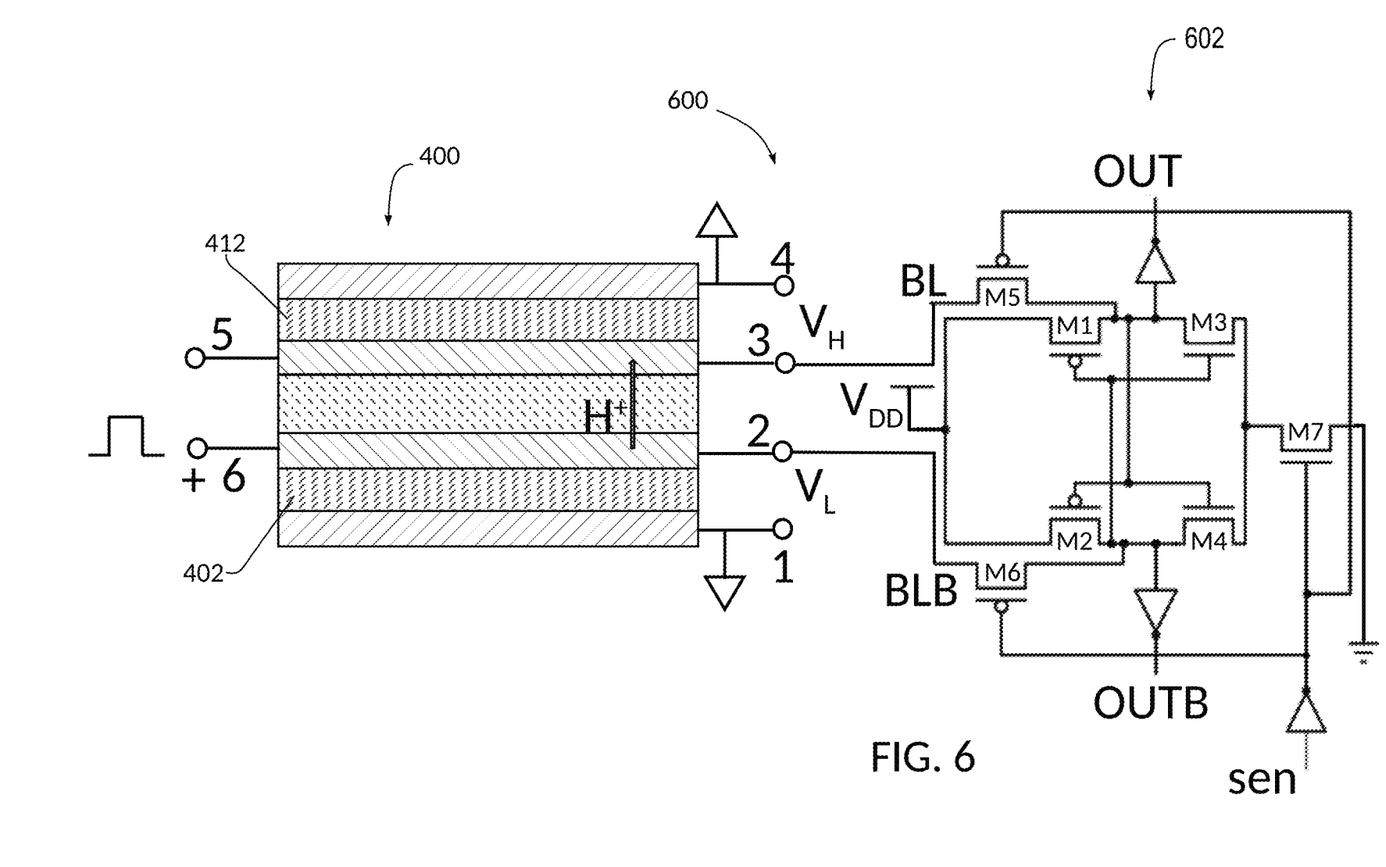
FIG. 6 depicts, in a schematic, another memory circuit that includes the symmetric planar piezoelectric memory element that is shown in FIG. 4.

FIG. 6 depicts, in a schematic, another memory circuit 600 that includes the symmetric planar piezoelectric memory element 400 that is shown in FIG. 4. The memory circuit 600 also includes, as a readout circuit, a latching sense amplifier 602. An ordinary skilled worker will be familiar with circuitry to implement a latching sense amplifier. In the circuit 602, transistors M1, M3, M2, M4 are connected to provide two cross-coupled inverters for true and complementary bit lines BL, BLB. When signal sen is not supplied to the transistors M5, M6, M7, the inverters latch the difference in voltage between BL and BLB. When signal sen is supplied, the inverters amplify the difference in voltage to a full-swing voltage between outputs OUT and OUTB.

Figure 7:
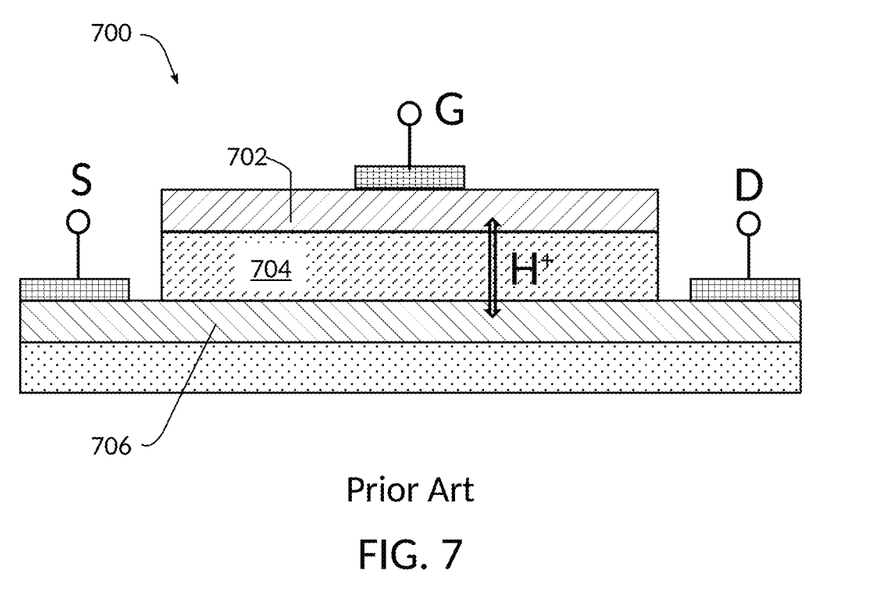
FIG. 7 depicts, in a schematic, a hydrogen-activated memory element, according to the prior art.

FIG. 7 depicts, in a schematic, a hydrogen-activated memory element 700, according to the prior art. Applying a high (one) bit to the gate terminal G causes a hydrogen charge $H^+$ to move from a first hydrogen reservoir 702 (Pd layer) through a dielectric 704 (PSG) to a channel layer 706 made of tungsten oxide ($WO_3$). The channel 706 is normally highly resistive. When hydrogen is introduced to layer 706, the $WO_3$ changes to $WO_2$—OH+e (e=is a free electron), effectively "doping" layer 706, which enables it to conduct current from source terminal S to drain terminal D. Applying a low (zero) bit to the gate terminal G while applying a high (one) bit to the source terminal S drives the hydrogen charge $H^+$ back to the first hydrogen reservoir, rendering channel 706 non-conductive again. The first hydrogen reservoir is a conductive material, preferably a noble metal such as palladium. The second hydrogen reservoir is a metal oxide, such as tungsten oxide ($WO_3$). The dielectric 704 is permeable to hydrogen; phosphosilicate glass is an exemplary suitable material for the dielectric. An ordinary skilled worker will appreciate that the memory element 700 uses hydrogen to change the chemical structure of layer 706 so it can conduct current, so that its mechanism of operation is entirely distinct from the piezoelectric operation of the memory elements 100, 200, 400.

The invention has been discussed in terms of a binary memory holding a logical "1" or logical "0". However, it is also possible to use the memory as multilevel memory by changing the amount of hydrogen that is shuttled between the hydrogen reservoirs. This allows to control the amount compressive/tensile strain extracted on the piezoelectric layer. This in turn will lead to an intermediate output voltage that can be used for creating additional memory levels.

Given the discussion thus far, it will be appreciated that, in general terms, an exemplary non-volatile memory apparatus 100, 200, 400 includes a first hydrogen reservoir 110, 210, 410, which is electrically conductive; a charge of hydrogen $H^+$, which is captured in the first hydrogen reservoir; a dielectric layer 108, 208, 408 that has a first side that is adjacent to the first hydrogen reservoir and a second side that is opposite from the first hydrogen reservoir; a second hydrogen reservoir 104, 204, 404 that is adjacent to the second side of the dielectric layer, is electrically conductive, and has a side that is opposite from the dielectric layer; and a piezoelectric layer 102, 202, 402 that is adjacent to the side of the second hydrogen reservoir and that has a side that is opposite from the second hydrogen reservoir.

In one or more embodiments, each of the first and second hydrogen reservoirs includes a metal. In some embodiments, each of the first and second hydrogen reservoirs includes a same metal. For example, each of the first and second hydrogen reservoirs includes a metal selected from the list of: palladium, platinum, vanadium, tungsten, hafnium, zirconium, niobium, tantalum, and titanium.

In one or more embodiments, the dielectric layer includes phosphosilicate glass.

In one or more embodiments, the non-volatile memory apparatus also includes: a first programming contact 5 that is electrically connected to the first hydrogen reservoir; a second programming contact 6 that is electrically connected to the second hydrogen reservoir; a conductive neutral layer 406 that is adjacent to the side of the piezoelectric layer that is opposite from the second hydrogen reservoir; and a readout circuit 502, 602 that is electrically connected to at least one of the first and second hydrogen reservoirs.

In one or more embodiments, the readout circuit is connected across the first and second hydrogen reservoirs. In one or more embodiments, the readout circuit is connected across the second hydrogen reservoir and the neutral layer.

In one or more embodiments, the readout circuit includes an operational amplifier. In one or more embodiments, the readout circuit includes a sense amplifier. In one or more embodiments, the readout circuit includes a latch circuit.

In one or more embodiments, each of the first and second hydrogen reservoirs includes a film of metal that is between about 10 nm and about 50 nm thick and the longest dimension of each reservoir is about 50 nm to about 100 nm.

In one or more embodiments, the piezoelectric layer includes a material selected from the list consisting of: lead zirconate titanate, barium niobate, and ferroelectric hafnium oxide.

Another aspect provides a method for operating a non-volatile memory apparatus. The apparatus includes first and second hydrogen reservoirs 104, 110, a dielectric layer 108 that partitions the hydrogen reservoirs, a piezoelectric layer 102 that is adjacent to the second hydrogen reservoir, and a neutral layer 106 that is at a side of the piezoelectric layer opposite from the second hydrogen reservoir. The method includes setting a high bit on the memory apparatus by inducing a strain on the piezoelectric layer; inducing the strain includes moving hydrogen from the first hydrogen reservoir through the dielectric layer to the second hydrogen reservoir. Moving the hydrogen includes applying an electric field across the hydrogen reservoirs.

In one or more embodiments, the method also includes reading the high bit from the memory apparatus by connecting a readout circuit to at least one of the hydrogen reservoirs. In one or more embodiments, connecting the readout circuit includes connecting the readout circuit across the hydrogen reservoirs. In one or more embodiments, connecting the readout circuit includes connecting the readout circuit across the second hydrogen reservoir and the neutral layer. In one or more embodiments, connecting the readout circuit includes connecting a pair of operational amplifiers across the hydrogen reservoirs, so that the pair of operational amplifiers form part of a high-input-impedance amplifier.

According to another aspect, a piezoelectric memory apparatus 100, 200, 400 includes a piezoelectric layer 102, 202, 402; programmable means 104, 108, 110, 204, 208, 210, 404, 408, 410, 3, 4, 5, 6 for placing and removing a strain on the piezoelectric layer; and a readout circuit 502, 602 that is connected to the programmable means.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Materials such as palladium, lead zirconate titanate, and other metallic compounds may be deposited by, for example, chemical vapor deposition (CVD), plasma enhanced chemical vapor deposition (PECVD), physical vapor deposition (PVD), plating, thermal or e-beam evaporation, or sputtering. The various vapor deposition methods often give superior control of layer thickness and structure.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A non-volatile memory apparatus that comprises:
 a first hydrogen reservoir, wherein the first hydrogen reservoir is electrically conductive;
 a charge of hydrogen, which is captured in the first hydrogen reservoir;
 a dielectric layer that has a first side that is adjacent to the first hydrogen reservoir and a second side that is opposite from the first hydrogen reservoir;
 a second hydrogen reservoir that is adjacent to the second side of the dielectric layer, wherein the second hydrogen reservoir is electrically conductive and has a side that is opposite from the dielectric layer; and
 a piezoelectric layer that is adjacent to the side of the second hydrogen reservoir and that has a side that is opposite from the second hydrogen reservoir.

2. The apparatus of claim 1, wherein each of the first and second hydrogen reservoirs comprises a metal.

3. The apparatus of claim 2, wherein each of the first and second hydrogen reservoirs comprises a same metal.

4. The apparatus of claim 2, wherein each of the first and second hydrogen reservoirs comprises a metal selected from the list consisting of: palladium, platinum, vanadium, tungsten, hafnium, zirconium, niobium, tantalum, and titanium.

5. The apparatus of claim 1, wherein the dielectric layer comprises phosphosilicate glass.

6. The apparatus of claim 1, further comprising:
 a first programming contact that is electrically connected to the first hydrogen reservoir;
 a second programming contact that is electrically connected to the second hydrogen reservoir;
 a conductive neutral layer that is adjacent to the side of the piezoelectric layer that is opposite from the second hydrogen reservoir, and a readout circuit that is electrically connected to at least one of the first and second hydrogen reservoirs.

7. The apparatus of claim 6, wherein the readout circuit is connected across the first and second hydrogen reservoirs.

8. The apparatus of claim 6, wherein the readout circuit is connected across the second hydrogen reservoir and the neutral layer.

9. The apparatus of claim 6, wherein the readout circuit comprises an operational amplifier.

10. The apparatus of claim 9, wherein the readout circuit comprises a sense amplifier.

11. The apparatus of claim 10, wherein the readout circuit comprises a latch circuit.

12. The apparatus of claim 1, wherein each of the first and second hydrogen reservoirs comprises a film of metal that is between about 10 nm and about 50 nm thick and wherein a longest dimension of each reservoir is about 50 nm to about 100 nm.

13. The apparatus of claim 1, wherein the piezoelectric layer comprises a material selected from the list consisting of: lead zirconate titanate, barium niobate, and ferroelectric hafnium oxide.

14. A method for operating a non-volatile memory apparatus, which comprises first and second hydrogen reservoirs, a dielectric layer that partitions the hydrogen reservoirs, a piezoelectric layer that is adjacent to the second hydrogen reservoir, and a neutral layer that is at a side of the piezoelectric layer opposite from the second hydrogen reservoir, the method comprising:
 setting a high bit on the memory apparatus by inducing a strain on the piezoelectric layer, wherein inducing the strain comprises:
 moving hydrogen from the first hydrogen reservoir through the dielectric layer to the second hydrogen reservoir, wherein moving the hydrogen comprises:
 applying an electric field across the hydrogen reservoirs.

15. The method of claim 14, further comprising:
 reading the high bit from the memory apparatus by connecting a readout circuit to at least one of the hydrogen reservoirs.

16. The method of claim 15, wherein connecting the readout circuit comprises connecting the readout circuit across the hydrogen reservoirs.

17. The method of claim 15, wherein connecting the readout circuit comprises connecting the readout circuit across the second hydrogen reservoir and the neutral layer.

18. The method of claim 15, wherein connecting the readout circuit comprises connecting a pair of operational amplifiers across the hydrogen reservoirs, wherein the pair of operational amplifiers form part of a high-input-impedance amplifier.

19. A piezoelectric memory apparatus comprising:
 a piezoelectric layer;
 programmable means for placing and removing a strain on the piezoelectric layer so as to store a value directly in the piezoelectric layer; and
 a readout circuit that is connected to the programmable means to read out the value stored directly in the piezoelectric layer.

20. A piezoelectric memory apparatus comprising:
 a piezoelectric layer;
 programmable means for placing and removing a strain on the piezoelectric layer; and
 a readout circuit that is connected to the programmable means;
 wherein the programmable means comprise a dielectric layer, a first hydrogen reservoir that is disposed at a first side of the dielectric layer, a second hydrogen reservoir that is disposed at a second side of the dielectric layer that is opposite from the first hydrogen reservoir and between the dielectric layer and the piezoelectric layer, and a charge of hydrogen in at least one of the hydrogen reservoirs.

* * * * *